(12) United States Patent
Janos et al.

(10) Patent No.: US 6,987,269 B2
(45) Date of Patent: Jan. 17, 2006

(54) APPARATUS AND PROCESS FOR MEASURING LIGHT INTENSITIES

(75) Inventors: Alan C. Janos, Darnestown, MD (US); Betty Zhang, Gaithersburg, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 246 days.

(21) Appl. No.: 10/248,074

(22) Filed: Dec. 16, 2002

(65) Prior Publication Data

US 2004/0113089 A1     Jun. 17, 2004

(51) Int. Cl.
    *G01J 5/02*        (2006.01)
(52) U.S. Cl. ..................................... 250/372
(58) Field of Classification Search ............... 250/372; 438/22, 88
    See application file for complete search history.

(56) References Cited

U.S. PATENT DOCUMENTS

| 4,772,124 A | 9/1988 | Wooten et al. |
| 4,885,047 A | 12/1989 | Ury et al. |
| 6,090,534 A * | 7/2000 | Costigan et al. ............ 430/329 |
| 6,390,019 B1 * | 5/2002 | Grimbergen et al. ... 118/723 R |

OTHER PUBLICATIONS

U.S. Appl. No. 10/000,772, filed Nov. 30, 2001, Janos et al.
Katznelson, R.D. and Frohman-Bentchkowsky, D. "An Erase Model for FAMOS EPROM Devices", IEEE Transactions on Electron Devices, vol. ED-27, No. 9, Sep. 1980, pp. 1744–1752.

* cited by examiner

Primary Examiner—David Porta
Assistant Examiner—Marcus Taningco
(74) Attorney, Agent, or Firm—Cantor Colburn LLP

(57) ABSTRACT

An apparatus and process for measuring light intensities includes the use of a probe. The probe is configured for monitoring a wavelength range from about 180 nanometers to about 270 nanometers (nm). The probe comprises a reflective and diffusive layer adapted for collecting light; a waveguide having one end in optical communication with the reflective and diffusive layer, wherein the waveguide has greater than about 50 percent transmission at wavelengths of about 180 nm to about 270 nm; a sensor probe in optical communication with the other end of the waveguide; and a filter intermediate to the waveguide and the sensor, wherein the filter is adapted to remove wavelengths greater than about 270 nm and has a percent transmission at wavelengths of about 180 nm to about 270 nm greater than about 50 percent.

7 Claims, 7 Drawing Sheets

US 6,987,269 B2

APPARATUS AND PROCESS FOR MEASURING LIGHT INTENSITIES

BACKGROUND

This disclosure generally relates to devices and processes for measuring the intensity of light, and more particularly, to a probe for collecting light in a zone characterized by radiation less than about 270 nanometers and limited access for placing or installing instrumentation.

During fabrication of an integrated circuit, it is well known that undesirable charge buildup can occur such as on the floating gate of an EPROM device, if applicable, and/or other areas of the integrated circuit. This charge buildup can lead to high voltages and cause electrical damage to the circuitry or alter the operation of the device if the charge buildup is not removed or neutralized. Charge buildup can readily occur during one or more of the numerous processing steps common to fabricating the integrated circuit. For example, charge buildup can occur during an annealing process, during metal ashing or etching processes, after via and pad formation steps, and the like. Integrated circuits typically employ 3 to 5 conductive metal layers, which during fabrication includes about 5 to about 7 processing steps that can contribute to charge buildup. It is important to erase the charge buildup as the device is being fabricated.

Charge buildup can be removed by periodically exposing the integrated circuit during fabrication to narrow-band ultraviolet radiation sources. Current charge-removal processes typically utilize a mercury electrode lamp that produces a narrow-band spectrum at a wavelength of about 254 nanometers (nm). The mercury lamp emits high-energy photons that propagate through the integrated circuit stack to impart energy to the stored electrons and trapped electrons as well as other charges that may be present. These energized electrons overcome the energy barriers that previously confined the electrons and other charges such that recombination can occur between the electrons and the electron holes or positive charges within the integrated circuit or be drained off of the device, thereby erasing or dissipating the charge buildup that occurred during the fabrication process. The narrow-band UV light exposure also increases the mobility of charges on other areas of the integrated circuit. However, the use of narrow band radiation sources is relatively slow and moreover, may not penetrate to those areas that require removal of the charge buildup since the integrated circuit is generally formed of many different types of layers, some of which fully adsorb or prevent the narrow band radiation from exposing subjacent layers.

Another process and apparatus includes exposing the integrated circuit to broadband radiation sources at low wavelengths ranging from ultraviolet wavelengths to vacuum ultraviolet wavelengths. Orders of magnitude in efficiency are obtained with devices and process employing broadband radiation relative to the narrow band wavelength exposure tools described above, providing faster throughput and more efficient removal of charge buildup. Moreover, since a broadband radiation pattern is employed, absorption by the various layers of the integrated circuit is overcome. The wavelengths of interest for the broadband radiation exposure are generally defined at about 270 nm to about 180 nm.

It is desirable to accurately monitor the wavelengths employed for charge erasure. For example, absorption of light in air and in the materials used in the fabrication of the integrated circuit can attenuate the light. Current radiometers are impractical or ineffective for use at wavelengths less than about 270 nm. Many of the commercially available radiometer devices include materials that absorb at the wavelengths of interest. Moreover, current radiometers and probes typically measure a wide range of wavelengths that overlap with the wavelengths of interests, thereby diminishing the sensitivity of the radiometer or probe for the range of interest. Still further, it is desirable to have the capability of measuring the emitted spectrum from the bulb under actual processing conditions (as opposed to measuring the spectrum of the bulb itself) since there could be many variables that affect transmission of the light from the bulb to the wafer location within the process chamber.

BRIEF SUMMARY

Disclosed herein are in situ and hand held probes for monitoring a wavelength range from about 180 nanometers to about 270 nanometers. In one embodiment, a hand held probe comprises a reflective and diffusive layer adapted for collecting light; a waveguide having one end in optical communication with the reflective and diffusive layer, wherein the waveguide has greater than about 50 percent transmission at wavelengths of about 180 nm to about 270 nm; a sensor in optical communication with the other end of the waveguide; and a filter intermediate to the waveguide and the sensor, wherein the filter is adapted to remove wavelengths greater than about 270 nm and has a percent transmission at wavelengths of about 180 nm to about 270 nm greater than about 50 percent.

An in situ probe comprises a waveguide having one end in optical communication with a light source, wherein the waveguide has greater than about 50 percent transmission at wavelengths of about 180 nm to about 270 nm; a sensor in optical communication with the other end of the waveguide; and a filter intermediate to the waveguide and the sensor, wherein the filter is adapted to remove wavelengths greater than about 270 nm and has a percent transmission at wavelengths of about 180 nm to about 270 nm greater than about 50 percent.

An integrated apparatus for monitoring charge erasure efficiency in a charge erasure tool comprises a radiation chamber comprising a light source adapted to emit broadband radiation at or within wavelengths of about 180 nm to about 270 nm; a process chamber comprising an in situ probe for monitoring an intensity of the broadband radiation at about 180 nm to about 270 nm, the in situ probe comprising a waveguide having one end in optical communication with the light source and an other end in optical communication with a sensor, wherein the waveguide has greater than about 50 percent transmission at wavelengths from about 180 nm to about 270 nm, and a filter intermediate to the waveguide and the sensor, wherein the filter is adapted to absorb wavelengths greater than about 270 nm; and a plate intermediate to the radiation chamber and the process chamber, wherein the plate is transmissive at wavelengths at about 180 nm to about 270 nm.

A process for monitoring radiation emitted in a charge erasure tool configured for removing or dissipating a charge buildup during fabrication of an integrated circuit comprises disposing a probe at a location in a process chamber of a charge erasure tool, the probe comprising a reflective and diffusive layer adapted for reflective and diffusive radiation, a waveguide having one end in optical communication with the reflective and diffusive layer, wherein the waveguide has greater than about 50 percent transmission at wavelengths from about 180 nm to about 270 nm, a sensor probe in optical communication with the other end of the waveguide, and a filter intermediate to the waveguide and the sensor, wherein the filter is adapted to remove wavelengths greater than about 270 nm; flowing an inert gas into the process chamber at a flow rate sufficient to remove ambient air from the process chamber; emitting radiation from a light source in a radiation chamber of the charge erasure tool; reflecting and diffusing radiation emitted from a light source of the charge erasure tool on the reflective and diffusive layer to the waveguide; and removing radiation at wavelengths greater than about 270 nm with the filter and transmitting the radiation to the sensor, wherein the responsivity of the probe is similar to a charge erasure efficiency curve.

In accordance with another embodiment, the process for monitoring radiation emitted in a charge erasure tool configured for removing or dissipating a charge buildup during fabrication of an integrated circuit comprises securing a probe at a location in a process chamber of a charge erasure tool at about a location of a substrate, the probe comprising a waveguide having one end in optical communication with a light source, wherein the waveguide has greater than about 50 percent transmission at wavelengths from about 180 nm to about 270 nm, a sensor in optical communication with the other end of the waveguide, and a filter intermediate to the waveguide and the sensor, wherein the filter is adapted to remove wavelengths greater than about 270 nm; flowing an inert gas into the process chamber at a flow rate sufficient to remove ambient air from the process chamber; emitting radiation from a light source in a radiation chamber of the charge erasure tool; reflecting and diffusing radiation emitted from a light source of the charge erasure tool on the reflective and diffusive layer to the waveguide; and removing radiation at wavelengths greater than about 270 nm with the filter and transmitting the radiation to the sensor, wherein the responsivity of the probe is similar to a charge erasure efficiency curve.

The above described and other features are exemplified by the following figures and detailed description.

BRIEF DESCRIPTION OF THE DRAWINGS

Referring now to the figures, which are exemplary embodiments and wherein the like elements are numbered alike.

DETAILED DESCRIPTION

Figure 1:
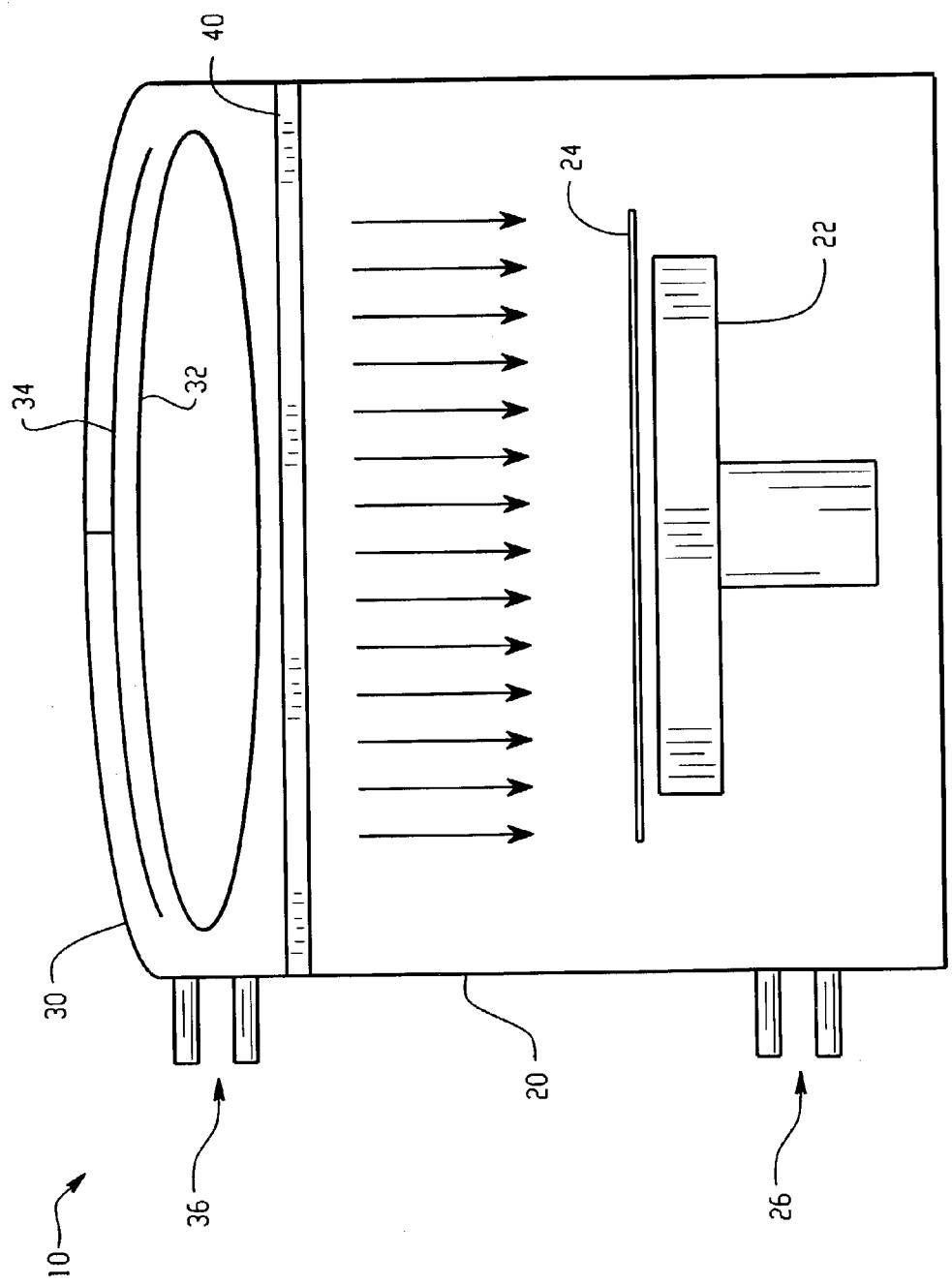
FIG. 1 illustrates a cross sectional view of an exemplary exposure tool for erasing charge buildup during the fabrication of an integrated circuit.

The present disclosure describes a probe for in situ or hand held use and a process using the probe for accurately measuring light intensity at wavelengths less than about 270 nm. The probe is especially suitable for use in measuring broadband light intensities discharged within a charge erasure tool, such as the one described in U.S. Pat. No. 6,803,319, assigned to Axcelis Technologies, Inc, incorporated herein by reference in its entirety. Referring now to FIG. 1, an exemplary charge erasure tool 10 for erasing or dissipating charge buildup that occurs during fabrication of an integrated circuit generally comprises a process chamber 20 and a radiation chamber 30. The process chamber 20 includes a support 22 e.g., a chuck, upon which a substrate 24 can be disposed, wherein the substrate 24 includes a partially or completely fabricated integrated circuit. The support 22 may further include an independent heating means. The radiation chamber 30 generally includes a light source 32 and a reflector 34. The light source 32 is adapted to emit radiation at wavelengths less than about 270 nm, which has been found to be effective for erasing or dissipating the charge buildup that occurs during fabrication of an integrated circuit. A plate 40 that is optically transparent at these wavelengths (below about 270 nm) is intermediate to the process chamber 20 and the radiation chamber 30. The process chamber 20 and the radiation chamber 30 may also include gas inlets and outlets, shown collectively at 26 and 36, respectively, for flowing an inert gas at a flow rate sufficient to remove ambient oxygen, which is known to adsorb wavelengths less than about 270 nm.

Figure 2:
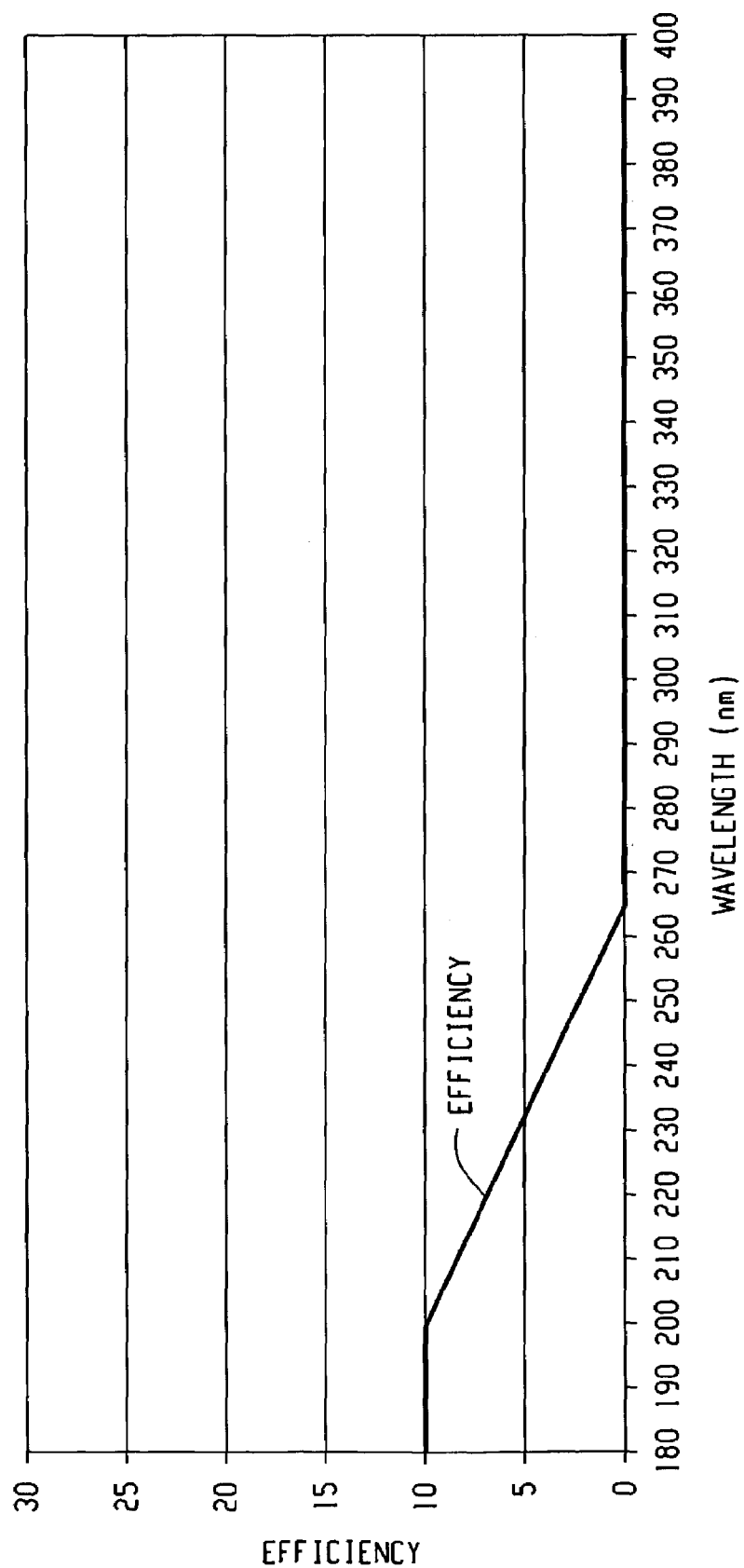
FIG. 2 graphically illustrates charge erasure efficiency as a function of wavelength.

FIG. 2 graphically illustrates a spectrum showing charge erasure efficiency as a function of wavelength that had been measured during fabrication of the integrated circuit. At wavelengths greater than about 270 nm, charge erasure does not occur to any measurable degree. It is not expected that an increase in intensity at wavelengths greater than about 270 nm will produce any measurable degree of charge dissipation. At wavelengths less than about 270 nm, charge erasure efficiency generally increases as wavelengths decrease from about 270 nm to about 200 nm. Below 200 nm, there appears to be a leveling off of the charge erasure efficiency, although the exact functional dependence is difficult to ascertain since there is relatively less broadband light energy emitted at these wavelengths from the light sources used to generate this erase efficiency curve.

Figure 3:
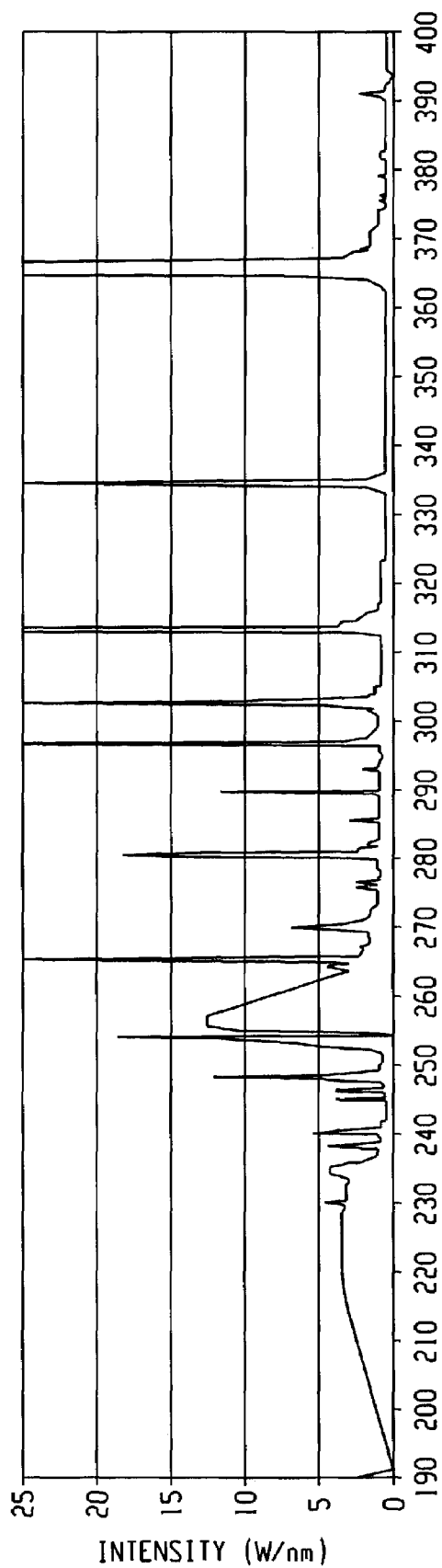
FIG. 3 graphically illustrates a spectrum illustrating intensity as a function of wavelength for an electrodeless microwave driven bulb.

For emitting wavelengths less than about 270 nm, an electrodeless microwave driven bulb is preferably employed as the light source 32 in the charge erasure tool 10 for emitting a broadband radiation pattern from about 270 nm to about 180 nm. During use, the bulb is preferably cooled such as by continuously flowing a non-absorbing gas, e.g., nitrogen, into the radiation chamber. An exemplary spectrum of an electrodeless microwave bulb suitable for effecting charge erasure or charge dissipation is shown in FIG. 3. This particular bulb is commercially available under the trade name HL from Axcelis Technologies, Inc. During use, a light collecting portion of the probe is disposed at desired locations within the process chamber 20. Ideally, the light-collecting portion is positioned at locations similar to the locations of the integrated circuit with the process chamber, i.e., at a plane similar to the substrate 24 that contains the partially completely fabricated integrated circuit, which will subsequently be exposed to the charge erasure radiation. In this manner, the wavelengths can advantageously be accurately monitored to ensure sufficient exposure at the charge erasure wavelengths to the substrate, thereby providing improved yields and throughputs. Moreover, the monitored wavelengths will be representative of actual exposure conditions.

Figure 4:
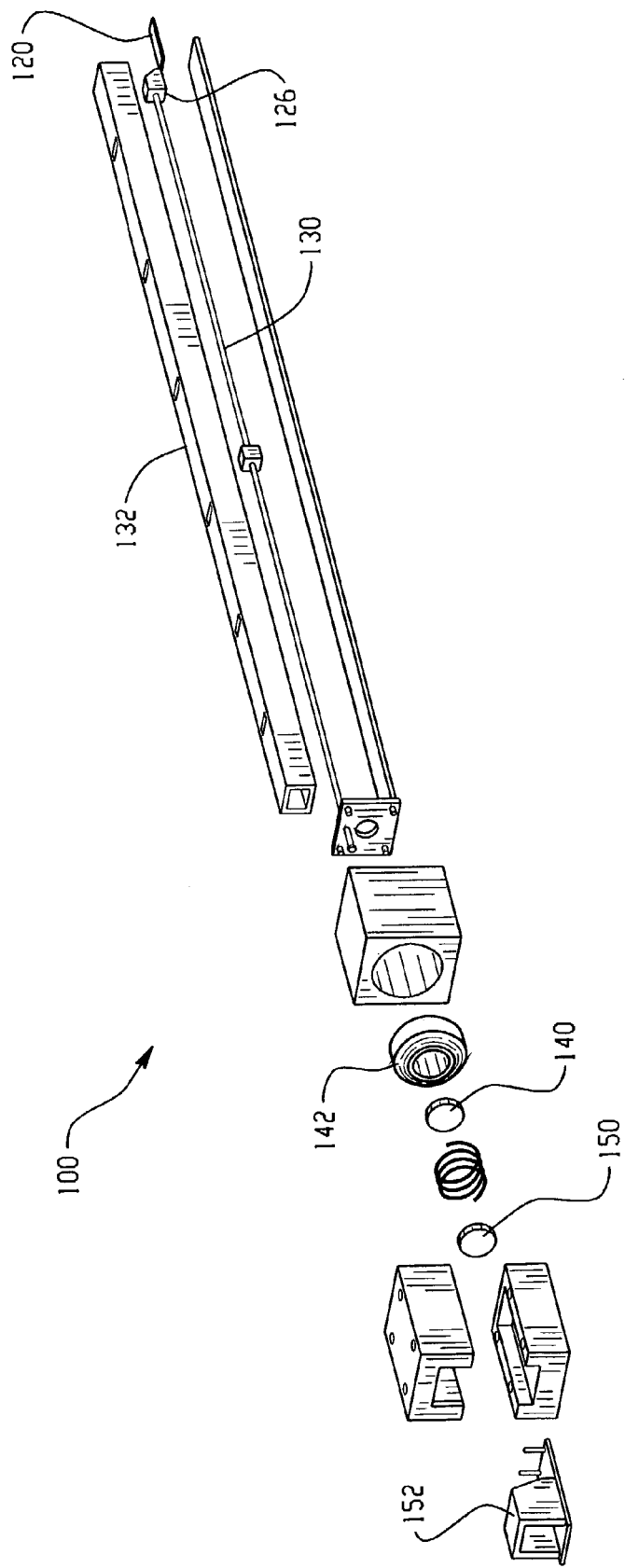
FIG. 4 illustrates an exploded sectional view of a probe.

Referring now to FIG. 4, there is shown an exemplary hand held probe generally designated 100 suitable for use in monitoring wavelengths effective for removing or dissipating charge buildup that occurs during the fabrication of an integrated circuit. The hand held probe 100 generally comprises, in optical communication, a diffuser pad 120, a waveguide 130, a filter 140, and a sensor 150. Preferably, a display is further provided to convert the electrical signals generated by the sensor 150 to provide a visual display indicative of the wavelength intensity spectrum below about 270 nm. In contrast, an in situ probe is free of the diffuser pad since the waveguide 130 can be positioned at a location in the charge erasure tool to receive the radiation transmitted from the light source. For example, the waveguide could be positioned and oriented to receive light at a location similar to the plane of the substrate, which can then be used to accurately determine the radiation that will impact the substrate during a charger erasure process.

Figure 5:
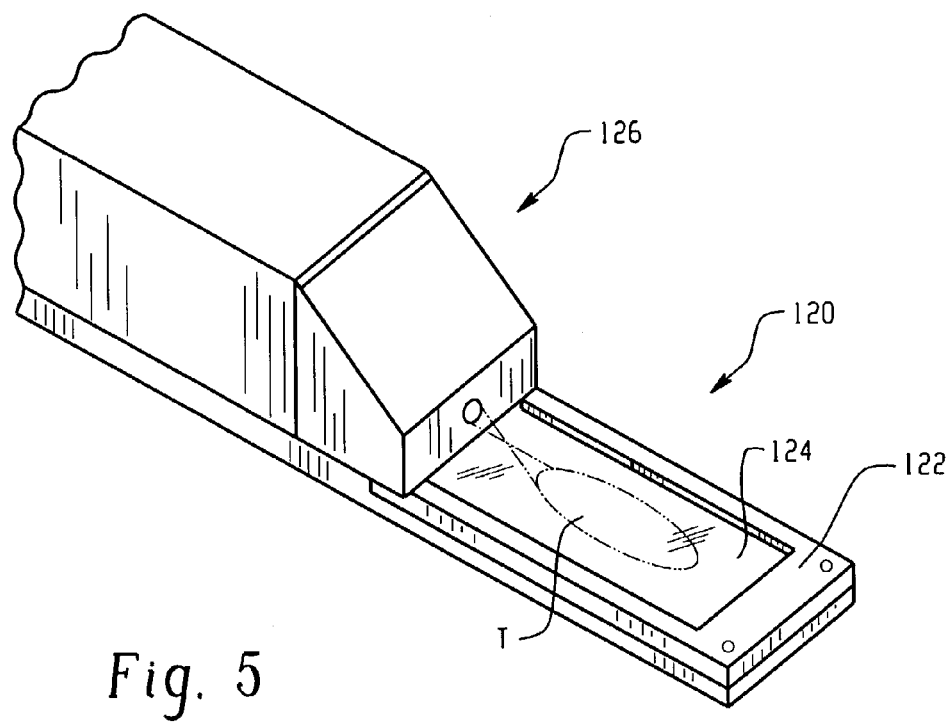
FIG. 5 is an isometric view of the diffuser pad and aperture block.

The diffuser pad 120 is the light-collecting element and receives light from all directions within the process chamber 20 of the charge erasure tool 10. For example, the diffuser pad 120 directly receives light from the light source 32 employed for emitting the broadband radiation sufficient for charge erasure as well as indirectly from the reflector 34 disposed behind the light source 32 as well as indirectly from the walls and other components with the erasure tool. The diffuser pad 120 diffusively reflects the light received such that the light detected by the sensor 150 is representative of all light rays incident on the diffuser pad 120. As shown more clearly in FIG. 5, the diffuser pad 120 generally comprises a support 122 and a reflective layer 124 formed thereon. The substrate 122 preferably is capable of forming a strong bond with the diffusive reflective layer 124, and brass has been found to be excellent for use as the substrate 122.

The diffusive reflective layer 124 may be any of a variety of materials that are well known in the optical industry for their diffusive, reflectivity properties. Preferably, the diffuser pad 120 does not adsorb the desired wavelengths, i.e., wavelengths below about 270 nm. Moreover, the materials chosen for the support 122 and the reflective layer 124 are suitable for the environment in which they are used.

Suitable reflective materials for use in high intensity ultraviolet environments because of their diffusive reflective and high temperature properties include, but are not intended to be limited to, magnesium carbonate, magnesium oxide, barium sulfate, and various fluorocarbon plastics such as, for example, polytetrafluoroethylene. In a preferred embodiment, the diffuser pad 120 is fabricated from high purity barium sulfate with a total reflectance greater than about 90%. Suitable high purity barium sulfate is commercially available as an emulsion under the trade name Munsell White Reflectance Coating Part No. 1181759 from Munsell Color Services, NY. The imulsion is coated onto a suitable support 122, which dries to a non-self radiating powdered coating with nearly perfect diffusivity and reflectivity. The absolute reflectace for some selected wavelengths are shown in Table 1.

TABLE 1

| Wavelength (nm) | Absolute Reflectance (8°/total) |
|---|---|
| 225 | 0.9346 |
| 250 | 0.9397 |
| 275 | 0.9481 |
| 300 | 0.9501 |

The thickness of the support 122 need only be thick enough to provide structural support for the reflective layer, which preferably will have a thickness of 0.001 inch or less. The support 122 can have a thickness as low as about 1 to about 3 millimeters (mm), which results in an instrument having a reflective surface within about 1 to about 3 mm of the surface being illuminated.

Figure 6:
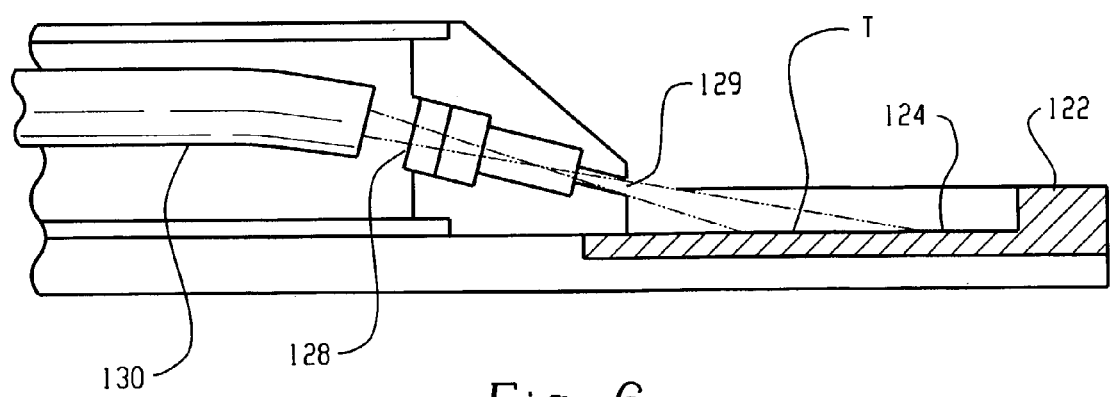
FIG. 6 is an enlarged sectional view showing the relationship between the pair of apertures in the aperture block and the fixed target area on the diffusive reflective layer.
Figure 7:
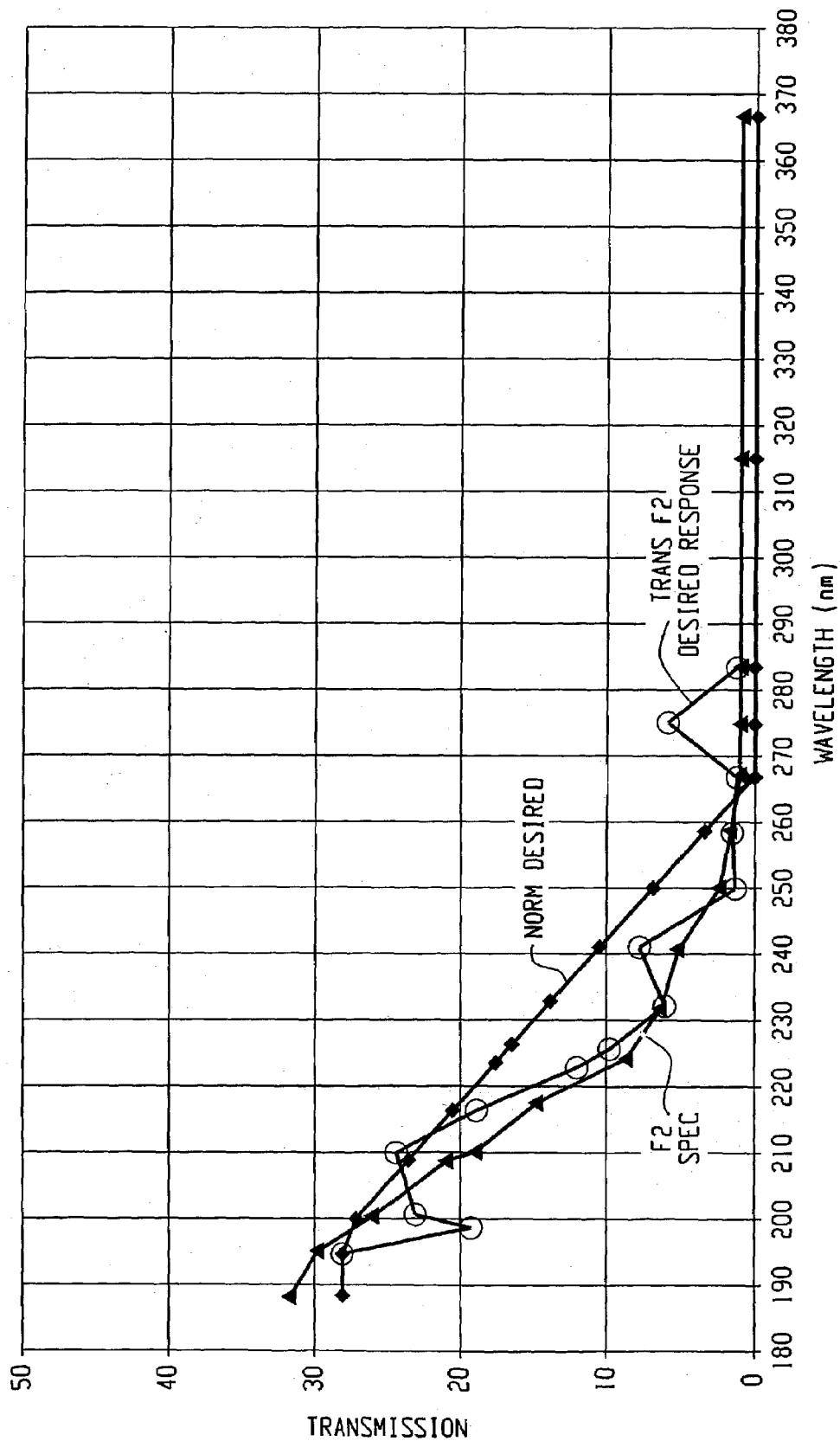
FIG. 7 graphically illustrates a response sensitivity curve of the probe compared to the charge erasure efficiency profile as a function of percent transmission relative to wavelength.

An aperture block 126 is mounted adjacent to the diffuser pad 120. One end of the waveguide 130 is positioned within the aperture block 126 to receive light reflecting from the diffuser pad 120. As shown more clearly in FIG. 6, apertures 128, 129 are disposed in the aperture block 126, which are oriented to define a fixed size elliptical target area T on the diffusive reflective layer 124. The size and shape of the target area T, all of which must be within the area of the coating of diffusive reflective layer 124, are determined by the size of the apertures 128, 129, the distance between aperture 129 and the target area, and the angle that the line of sight of the apertures 128, 129 makes with the diffusive reflective layer 124.

The sizes of the apertures 128, 129 are not critical. For example, an aperture diameter of about 0.030 inch for apertures 128, 129 spaced 0.375 inches apart and having a 0.375 inch line of sight from aperture 129 to the center of the target area, and having an angle of sight at an angle of 15 degrees will produce a target area that can be contained within an area having dimensions about ¼ inch by ¾ inch. Preferably, the line of sight that is established by apertures 128, 129 strikes the diffusive reflective layer 124 at an acute angle, preferably at an angle of about 10 degrees to about 30 degrees.

In a preferred embodiment, the waveguide 130 is in the form of an optical fiber contained within housing 132. For hand held devices, the length of the waveguide 130 is relatively long compared to the length employed for an in situ probe. The hand held probe is commonly employed to determine uniformity at multiple locations with the process chamber and, thus, must have sufficient length to reach all of the locations desired for determining uniformity. In contrast, the in situ probe requires a fixed length since it will generally be in a fixed position within the process chamber of the charge erasure tool. For relatively long optical path lengths, it is preferred that the materials employed as the waveguide 130 have minimal adsorption at the wavelengths of interest since total adsorption is a function of the length of the waveguide. If there is significant adsorption, then the resulting net response will be different for the two probes. This is usually not an acceptable situation since one generally desires that the spectrums provided by the probes, hand held or in situ, correlate with each other.

Preferably, the waveguide has greater than about 50 percent transmission at wavelengths from about 180 nm to about 270 nm, with greater than about 60 percent transmission at wavelengths from about 180 nm to about 270 nm more preferred, with greater than about 70 percent transmission at wavelengths from about 180 nm to about 270 nm even more preferred, and with greater than about 80 percent transmission at wavelengths from about 180 nm to about 270 nm most preferred. Of course, smaller wavelength ranges can be employed at these desired transmissions depending on the charge erasure application, so long as sufficient broadband radiation exposure occurs at wavelengths less than about 270 nm and is effective to remove or dissipate the charge build up. At shorter waveguide lengths, a greater amount of adsorption can be tolerated without deleteriously affecting sensitivity. Suitable waveguide materials include fused silica, silicon dioxide, doped silicon dioxides, polymers, interpolymers, and the like. In a preferred embodiment, the waveguide 130 is fabricated from fused silica. A suitable commercially available waveguide material is available under the trademark SUPRASIL from the Heraeus Corporation, Germany.

The housing 132 can be of any material capable of withstanding the environment to which the probe is to be exposed. In a preferred embodiment, the housing 132 is fabricated from a metal such as brass. The housing 132 should be sized and shaped so that it does not block light that would otherwise reach the target area. This requirement may in some instances control the angle of the line of sight and limit it to smaller angles such as from about 5 degrees to about 15 degrees.

The other end of the waveguide 130 is fitted with filter 140, which may be contained within a filter housing 142. Filter 140 preferably has a wavelength transmission curve similar to that considered effective for charge erasure. In a preferred embodiment, the filter 140 removes transmissions of wavelengths greater than about 270 nm to the sensor 150. At wavelengths greater than about 270 nm, sensitivity of the probe 100 was designed to decrease significantly since these wavelengths have little effect on charge erasure. As previously described and shown in FIG. 2, desired wavelengths for maximum charge erasure occurs at wavelengths less than about 270 nm. Moreover, since current light sources 32 employed in erasure tools 10 typically have low intensities at wavelengths less than about 270 nm, sensitivity of the probe 100 is maximized by removing transmissions of wavelengths greater than about 270 nm to the sensor 150. Still further, by removing wavelengths greater than about 270 nm, the spectral response sensitivity curve of the probe closely matches the charge erasure efficiency curve as shown in FIG. 2.

More preferably, the transmission of wavelengths at about 270 nm or greater through filter 140 is less than about 10 percent with decreasing transmission at wavelengths greater than about 270 nm, with a transmission less than about 5 percent more preferred, with a transmission less than about 3 percent even more preferred, and with a transmission less than 2 percent most preferred. At wavelengths of about 180 nm to about 270 nm, the filter preferably has a percent transmission greater than about 10 percent at its peak wavelength, with greater than 20 percent transmission at its peak wavelength more preferred, with greater than 30 percent transmission at its peak wavelength more preferred, and with greater than 40 percent transmission at its peak wavelength most preferred. Under idealized conditions, the filter 140 would provide 100% transmission at wavelengths of about 180 nm to about 270 nm and would be fully opaque at wavelengths greater than about 270 nm, i.e., a square function. A suitable filter for use in the probe 100 is commercially available under the part number 186-B from the Acton Research Corporation. This particular filter has a peak wavelength transmission at about 180 nm with about 32.8% transmission and a full width half maximum (FWHM) of about 40 nm. The term full-width half-maximum (FWHM) is hereinafter defined as the width across a wavelength profile when it drops to half of its peak, or maximum value. As previously discussed, ideally the FWHM would be across the wavelength spectrum of interest, i.e., from 180 nm to about 270 nm or an FWHM of about 90 nanometers at 235 nm.

Figure 8:
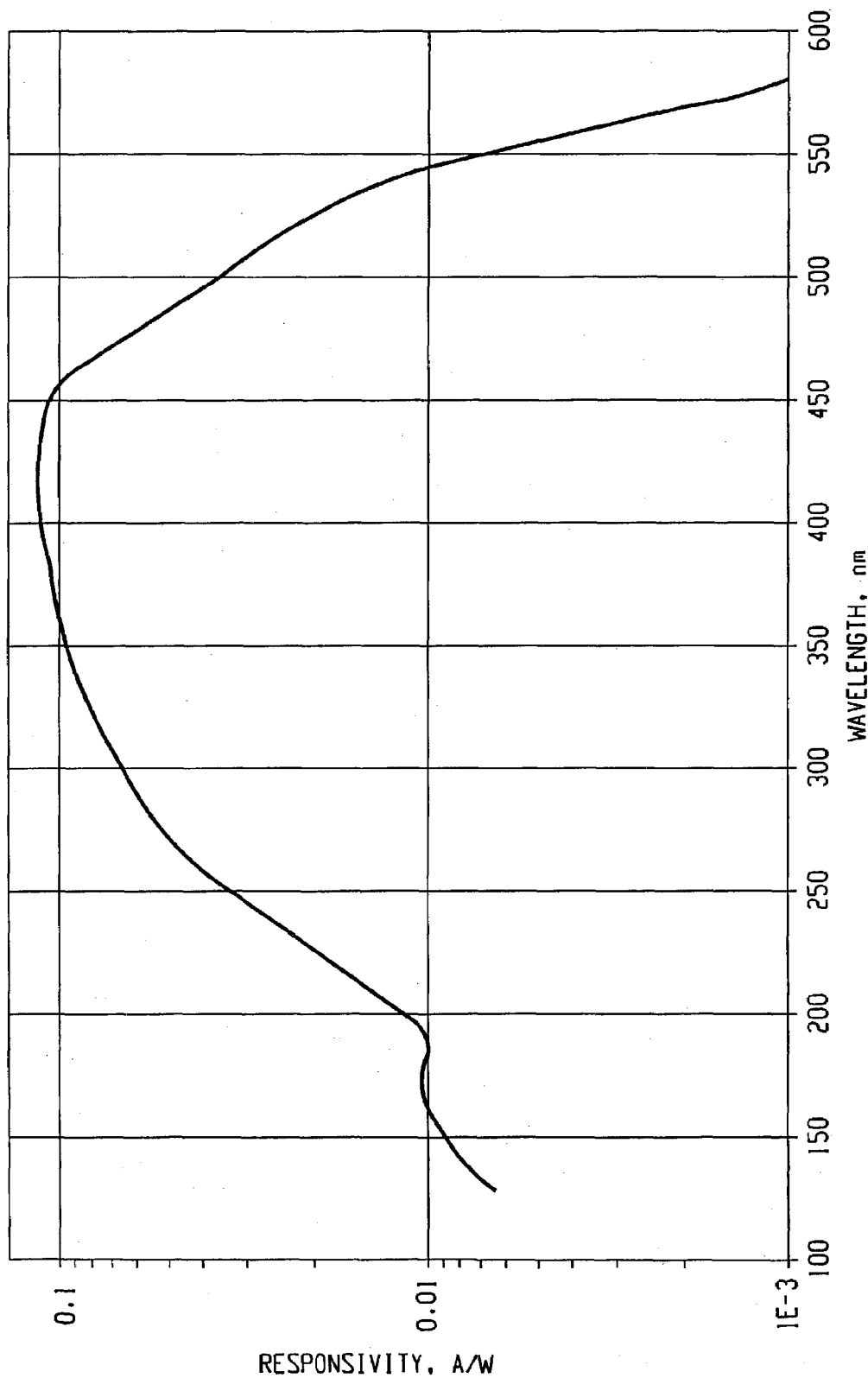
FIG. 8 graphically illustrates a sensitivity curve of a suitable sensor for use in the probe.

The sensor 150, e.g., a photodiode responsive to radiation at least about 180 nm to about 270 nm, receives the light collected from the other end of the waveguide 130. FIG. 8 graphically illustrates the responsivity as a function of wavelength for a suitable sensor. While the sensor 150 has a non-zero sensitivity extending to about 550 nm, the previously described filter 140 will eliminate this region. Also, while the sensitivity is not flat, it does exhibit a preferred slope in the wavelength region of interest (i.e., a slope similar to the charge erasure efficiency curve as shown in FIG. 2), which helps correct the overall response of the probe 100 so that the sensitivity of the entire probe system is similar to the desired erase efficiency curve.

A preferred sensor 150 is a gallium phosphorous photodiode commercially available under model number EPD-150-0 from Roithner Lasertechnik, Austria. Responsivity for this particular photodiode is 0.12 A/W at 440 nm. The sensor 150 converts the radiation to an electrical signal, which can be displayed in a display device by means of an electrical connector 152 therebetween.

In operation of the hand held probe, the diffuser pad of the probe is positioned at a desired location in the process chamber at about ninety degrees relative to the light source. In this manner, ultraviolet radiation which strikes the target area is diffused and reflected, and a small fraction of this reflected radiation enters the aperture set 128, 129 and is transmitted into waveguide 130. The combination of diffusive reflective layer 124 and the apertures 128, 129 provides sufficient diffusion of the incoming rays so that the angular response of the probe is nearly cosine in nature and consequently ultraviolet radiation that strikes at diverse angles can be measured accurately. During operation of the in situ probe, the waveguide is axially secured in the process chamber relative to the light source and radiation emitted from the light source enters the waveguide directly, preferably the waveguide is secured at a location similar to the location of a substrate to be processed. The radiation transmitted to the waveguide 130 by the in situ probe or hand held probe then passes through filter 140 and to the sensor 150. The sensor 150 converts the radiation to electrical signals correlating to specific wavelengths and intensities. The sensor 150 may further include electrical communication with a display device for displaying the converted electrical signals.

During continuous use of the hand held probe, the diffusive reflective layer 124 may heat up, and materials such as magnesium oxide, magnesium carbonate and barium sulfate show an increase in reflectivity with an increase in their temperatures. Appropriate compensations may be made to accommodate changes in reflectivity as a function of temperature, or the manner of use of the probe may be controlled to minimize the temperature effect as by measuring the light intermittently. For example, the probe 100 may be used to operate in a measuring mode for about 10 seconds and then off for 15 seconds to permit the surface to cool before another 10 second measurement is made.

Advantageously, the probes and processes described herein provide accurate measurement of those wavelengths effective for charge erasure. The probes are sensitive to only those wavelengths that effect charge erasure; wavelengths greater than about 270 nm are filtered from the photodiode of the probes, thereby providing maximum sensitivity. Moreover, the sensitivity response of the probes closely tracks the charge erasure efficiency response. In addition, the probes provide in situ measurement capabilities as well as hand held capabilities. Since there are many components within the charge erasure tool that can alter the spectrum of light impinging on the target substrate, it is a significant commercial advantage to measure the UV light within the tool and at locations similar to where the substrate is located, i.e., in the plane of the wafer.

Also advantageous, the probes provide accurate measurement of light incident from the entire hemisphere above the substrate, i.e., about $2\pi$ steradians, which may vary from location to location. The probes also provide a capability for measuring the weighted measurement per charge erasure efficiency. The probsse can be readily calibrated to measure the intensity of a particular light source employed in the charge erasure tool. For example, the wavelength band of interest to be measured is generally broad. Within that band, the charge erase efficiency can differ from wavelength to wavelength. Generally, the lower wavelengths are more effective and efficient in removing or dissipating charge buildup. Thus, in certain applications, it may be desirable to weight the sensitivity of the probe to the lower wavelength end of the emitted spectrum that impinges on the substrate so that one is sensitive to small but possible significant changes in erasure efficiency at the lower end of the wavelength range.

Moreover, the probes provide a means for determining the uniformity of the light source. Light sources can change over time with use and as such, the probes provide a means for measuring different locations so that non-uniformity of the light source can be taken into consideration. In this manner, the appropriate amount of exposure can be applied to the integrated circuit to remove or dissipate the charge buildup.

While the disclosure has been described with reference to an exemplary embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. An integrated apparatus for monitoring charge erasure efficiency in a charge erasure tool, the apparatus comprising:
    a radiation chamber comprising a light source adapted to emit broadband radiation at or within wavelengths of about 180 nm to about 270 nm, wherein the radiation chamber contains a gas that is substantially non-absorbing at the wavelengths during operation;
    a process chamber comprising an in situ probe for monitoring an intensity of the broadband radiation at about 180 nm to about 270 nm, the in situ probe comprising a reflective and diffusive layer adapted for collecting light disposed within the process chamber, and a waveguide having one end in optical communication with the reflective and diffusive layer and an other end in optical communication with a sensor, wherein the waveguide has greater than about 50 percent transmission at wavelengths from about 180 nm to about 270 nm, and a filter intermediate to the waveguide and the sensor, wherein the filter is adapted to absorb wavelengths greater than about 270 nm; and
    a plate intermediate to the radiation chamber and the process chamber, wherein the plate is transmissive at wavelengths at about 180 nm to about 270 nm.

2. The integrated apparatus according to claim 1, wherein the reflective and diffusive layer is at about a location of a substrate.

3. The integrated apparatus according to claim 1, wherein the probe exhibits enhanced sensitivity to the broadband radiation at about 180 nm to about 270 nm relative to a probe without the filter.

4. The integrated apparatus according to claim 1, wherein the filter has a transmission at a wavelength of about 270 nm or greater which is less than about 10 percent relative to a maximum transmission of the filter at wavelengths less than about 270 nm.

5. The integrated apparatus according to claim 1, wherein the filter has a transmission at a wavelength of about 270 nm or greater which is less than about 5 percent relative to a maximum transmission of the filter at wavelengths less than about 270 nm.

6. A process for monitoring radiation emitted in a charge erasure tool configured for removing or dissipating a charge buildup during fabrication of an integrated circuit; the process comprising:
    disposing a probe at a location in a process chamber of a charge erasure tool, the probe comprising a reflective and diffusive layer adapted for reflective and diffusive radiation, a waveguide having one end in optical communication with the reflective and diffusive layer, wherein the waveguide has greater than about 50 percent transmission at wavelengths from about 180 nm to about 270 nm, a sensor probe in optical communication with the other end of the waveguide, and a filter intermediate to the waveguide and the sensor, wherein the filter is adapted to remove wavelengths greater than about 270 nm;
    flowing an inert gas into the process chamber at a flow rate sufficient to remove ambient air from the process chamber;
    emitting radiation from a light source in a radiation chamber of the charge erasure tool;
    reflecting and diffusing radiation emitted from a light source of the charge erasure tool on the reflective and diffusive layer to the waveguide; and
    removing radiation at wavelengths greater than about 270 nm with the filter and transmitting the radiation to the sensor, wherein the responsivity of the probe is similar to a charge erasure efficiency curve.

7. A process for monitoring radiation emitted in a charge erasure tool configured for removing or dissipating a charge buildup during fabrication of an integrated circuit; the process comprising:
    securing a probe at a location in a process chamber of a charge erasure tool at about a location of a substrate, the probe comprising a waveguide having one end in optical communication with a light source, wherein the waveguide has greater than about 50 percent transmission at wavelengths from about 180 nm to about 270 nm, a sensor in optical communication with the other end of the waveguide, and a filter intermediate to the waveguide and the sensor, wherein the filter is adapted to remove wavelengths greater than about 270 nm;
    flowing an inert gas into the process chamber at a flow rate sufficient to remove ambient air from the process chamber;
    emitting radiation from a light source in a radiation chamber of the charge erasure tool;
    reflecting and diffusing radiation emitted from a light source of the charge erasure tool on the reflective and diffusive layer to the waveguide; and
    removing radiation at wavelengths greater than about 270 nm with the filter and transmitting the radiation to the sensor, wherein the responsivity of the probe is similar to a charge erasure efficiency curve.

\* \* \* \* \*